US008149728B2

(12) United States Patent
Kim

(10) Patent No.: US 8,149,728 B2
(45) Date of Patent: Apr. 3, 2012

(54) SYSTEM AND METHOD FOR EVALUATING PERFORMANCE OF MICROPHONE FOR LONG-DISTANCE SPEECH RECOGNITION IN ROBOT

(75) Inventor: Hyun-Soo Kim, Yongin-si (KR)

(73) Assignee: Samsung Electronics Co., Ltd., Yeongtong-Gu, Suwon-Si, Gyeonggi-Do (KR)

( * ) Notice: Subject to any disclaimer, the term of this patent is extended or adjusted under 35 U.S.C. 154(b) by 141 days.

(21) Appl. No.: 12/127,867

(22) Filed: May 28, 2008

(65) Prior Publication Data

US 2008/0298599 A1 Dec. 4, 2008

(30) Foreign Application Priority Data

May 28, 2007 (KR) ........................ 10-2007-0051740

(51) Int. Cl.
*G01R 31/08* (2006.01)

(52) U.S. Cl. ........................................................ 370/252

(58) Field of Classification Search .................. 370/203; 381/58, 92

See application file for complete search history.

(56) References Cited

U.S. PATENT DOCUMENTS

| | | | | |
|---|---|---|---|---|
| 4,449,238 | A * | 5/1984 | Lee et al. | 381/110 |
| 4,741,038 | A * | 4/1988 | Elko et al. | 381/92 |
| 5,625,607 | A * | 4/1997 | Chaya | 369/13.17 |
| 5,715,372 | A * | 2/1998 | Meyers et al. | 706/16 |
| 5,774,850 | A * | 6/1998 | Hattori et al. | 704/250 |
| 6,219,645 | B1 | 4/2001 | Byers | 704/275 |
| 6,505,161 | B1 * | 1/2003 | Brems | 704/270 |
| 6,993,486 | B2 * | 1/2006 | Shimakawa | 704/275 |
| 7,505,901 | B2 * | 3/2009 | Kaltenmeier et al. | 704/231 |
| 2007/0033020 | A1 * | 2/2007 | (Kelleher) Francois et al. | 704/226 |
| 2008/0019535 | A1 * | 1/2008 | Mitsuhashi et al. | 381/66 |
| 2008/0055238 | A1 * | 3/2008 | Sorenson | 345/156 |
| 2008/0159559 | A1 * | 7/2008 | Akagi et al. | 381/92 |

(Continued)

FOREIGN PATENT DOCUMENTS

EP 0 682 436 A2 11/1995

(Continued)

OTHER PUBLICATIONS

Barker, Simon, et al.; Patent Application Publication No. US 2006/0069557 A1; Publication Date: Mar. 30, 2006; "Microphone Setup and Testing in Voice Recognition Software;".

(Continued)

*Primary Examiner* — Kwang B Yao
*Assistant Examiner* — Jung-Jen Liu
(74) *Attorney, Agent, or Firm* — Cha & Reiter, LLC

(57) ABSTRACT

A system and method for evaluating performance of a microphone for long-distance speech recognition, which enables a robot to receive and respond to voices. A robot, which includes a network robot, must correctly recognize speech in order to recognize the user and to perceive its surroundings, objective evaluation criteria are required for choosing a microphone to be used in the robot. The methods include measuring a degree of attenuation of the voice, measuring a degree of distortion of the voice, and simultaneously measuring the degree of attenuation of the voice and the degree of distortion of the voice. A standard for the choice of a microphone, which can be digitalized, for a speech recognition function of a robot, permits choice of a microphone which has good sensitivity and can pick up voices without distortion when used at a large distance.

15 Claims, 4 Drawing Sheets

U.S. PATENT DOCUMENTS

| | | | | |
|---|---|---|---|---|
| 2008/0170717 | A1 * | 7/2008 | Liu et al. | 381/92 |
| 2009/0234618 | A1 * | 9/2009 | Taenzer et al. | 702/189 |

FOREIGN PATENT DOCUMENTS

| | | |
|---|---|---|
| JP | 59-019821 | 2/1984 |
| JP | 2002-369296 | 12/2002 |
| KR | 2005-22952 | 3/2005 |

OTHER PUBLICATIONS

Pfeifer, Guenther, et al.; Patent Application Publication No. US 2007/0041598 A1; Publication Date: Feb. 22, 2007; “System for Location-Sensitive Reproduction of Audio Signals;”.

* cited by examiner

SYSTEM AND METHOD FOR EVALUATING PERFORMANCE OF MICROPHONE FOR LONG-DISTANCE SPEECH RECOGNITION IN ROBOT

CLAIM OF PRIORITY

This application claims priority under 35 U.S.C. §119 from an application entitled "System And Method For Evaluating Performance Of Microphone For Long-Distance Speech recognition In Robot," filed with the Korean Intellectual Property Office on May 28, 2007 and assigned Serial No. 2007-51740, the contents of which are incorporated herein by reference in its entirety.

BACKGROUND OF THE INVENTION

1. Field of the Invention

The present invention relates to a system and method for speech recognition and its application in robotic systems. More particularly, the present invention relates to a system and method for evaluating the performance of a microphone for long-distance speech recognition in a robot, including mobile robots.

2. Description of the Related Art

In recent years, much attention has been drawn to mobile robots due to the need for health, security, home networks, entertainment, and so on. Mobile robots can perform many tasks that range from tedious to unsafe. In order to operate these mobile robots, human-robot interaction (HRI) is essential. In other words, the mobile robot must be able to recognize the user and to perceive its surroundings by using a robotic vision system so that, like the user, the mobile robot is able to identify the location of the user talking around the robot, as well as to understand commands given by the user.

A mobile robot typically includes a voice input system, which is an essential element for autonomous navigation, as well as for human-robot interaction. Important issues affecting the performance of the voice input system of the mobile robot in an indoor environment include sound and voices from televisions, movies, and computers, as well as noises, reverberations, and the distances which such sounds are projected.

In an indoor environment, there are reverberations of sound due to various noise sources, walls, or other objects. The low frequency component of a human voice has a characteristic that it is attenuated more than the high frequency component according to distance. Therefore, a voice input system that enables an autonomous navigation robot to receive the normal voice of the user at a distance of several meters and to use the received voice directly for speech recognition is required for human-robot interaction in the indoor environment.

In such a voice input system, the choice of microphone is important part of improving the quality of voice and a speech recognition rate. Since a voice input through a microphone must be transduced into electrical signals to provide the voice of the user at a large distance to a feature extraction unit or noise removal unit of a voice recognizer, with as little distortion as possible, an evaluation method for performance comparison of microphones is required.

However, due to the fact that the choice of microphone depends on the characteristics of microphones provided by microphone manufacturers, there is a limitation in evaluating a microphone according to the characteristics of the microphone itself, i.e., the frequency characteristic thereof, the directional characteristic thereof, etc., with respect to a terminal, such as a robot that must be able to receive voices at a large distance.

Therefore, if an input analog voice signal itself is distorted by the microphone, there is no alternative but for the distorted voice signal to be transferred, and also there is no choice but to use the distorted voice signal in the following processing procedures, that is, in an analog/digital conversion procedure, a noise removal procedure, a feature extraction procedure, and so on. For this reason, although a very high-level voice processing algorithm is employed, the possibility of misrecognition in recognizing voices is nevertheless very high.

Meanwhile, as the distance between a microphone and the user increases, it is necessary to increase a gain of a preamplifier to higher and still higher levels in order to recognize voices at a long (increased) distance. However, in this case, there is a known problem in that noise is amplified along with the voice. Therefore, it is necessary to develop an evaluation method for choosing a microphone having a relatively higher sensitivity at a long distance. In the voice at far-talking, in case of the mobile terminal, a distance of considered as far-talking is more than 30 centimeters, and in case of the robot, a distance considered as far-talking is 100 centimeter.

As described above, conventionally, a microphone is chosen only based on the characteristics of microphones provided by the microphone manufacturers. However, in the case of a microphone installed on or in a terminal, such as a robot, the capability of the microphone may not be realized due to volume attenuation according to noises, reverberations, and distance.

In addition, in order for a robot to recognize speech, it is necessary to establish objective evaluation criteria for choosing a microphone which has good sensitivity and can pick up voices at increased distances without distortion increased according to the increased distance.

SUMMARY OF THE INVENTION

Accordingly, the present invention has been made in part to solve at least some of the above-mentioned problems occurring in the prior art, and to provide at least the advantages discussed herein below. The present invention provides a system and method for evaluating the performance of a microphone for a robot, which recognizes voices at increasing distances, so as to provide an objective measure required for evaluation of the characteristics of the microphone.

In addition, the present invention provides a system and method for evaluating the performance of a microphone for a robot, which recognizes voices at a relatively large (increasing) distance, so as to enable a degree of attenuation of a voice and/or a degree of distortion of the voice to be measured at increased distances.

In accordance with an aspect of the present invention, there is provided a system for evaluating performance of a microphone for long-distance speech recognition in a robot, the system may typically include: a reference voice database for storing a voice signal required for performance evaluation of at least two microphones; a measurement value calculator for measuring and digitalizing at least one of attenuation and distortion of the input voice signal according to a selected performance evaluation criterion, when the voice signal from the reference voice database is input to a reference microphone and a target microphone among the microphones; a comparator for comparing a measurement result digitalized by the measurement value calculator with a reference value; and a microphone chooser for determining whether to choose the target microphone according to a result of the comparison.

In accordance with another aspect of the present invention, there is provided a system for evaluating performance of a microphone for long-distance speech recognition in a robot, the system may typically include: a reference voice database for storing a voice signal required for performance evaluation of at least two microphones; a measurement value calculator for calculating a voice attenuation ratio between the microphones in order to measure attenuation of the input voice signal, when the voice signal from the reference voice database is input to a reference microphone and a target microphone among the microphones; and a microphone chooser for determining whether to choose the target microphone, according to a result of comparison between a result calculated by the measurement value calculator and a reference value.

In accordance with still another aspect of the present invention, there is provided a method for evaluating performance of a microphone for long-distance speech recognition in a robot, the method including the steps of: inputting a voice signal required for performance evaluation to a reference microphone and a target microphone among at least two microphones; calculating a voice attenuation ratio between the microphones in order to measure attenuation of the input voice signal when the voice signal is input; comparing the calculated voice attenuation ratio between the microphones with a reference value; and determining whether to choose the target microphone according to a result of the comparison.

In accordance with still another aspect of the present invention, there is provided a method for evaluating performance of a microphone for long-distance speech recognition in a robot, the method including the steps of: inputting a voice signal required for performance evaluation to a reference microphone and a target microphone among at least two microphones; measuring and digitalizing at least one of attenuation and distortion of the voice signal according to a selected performance evaluation criterion when the voice signal is input; comparing the digitalized measurement result with a reference value; and determining whether to choose the target microphone according to a result of the comparison.

BRIEF DESCRIPTION OF THE DRAWINGS

The above and other exemplary aspects, features and advantages of the present invention will be more apparent from the following detailed description taken in conjunction with the accompanying drawings, in which.

DETAILED DESCRIPTION

Figure 1:
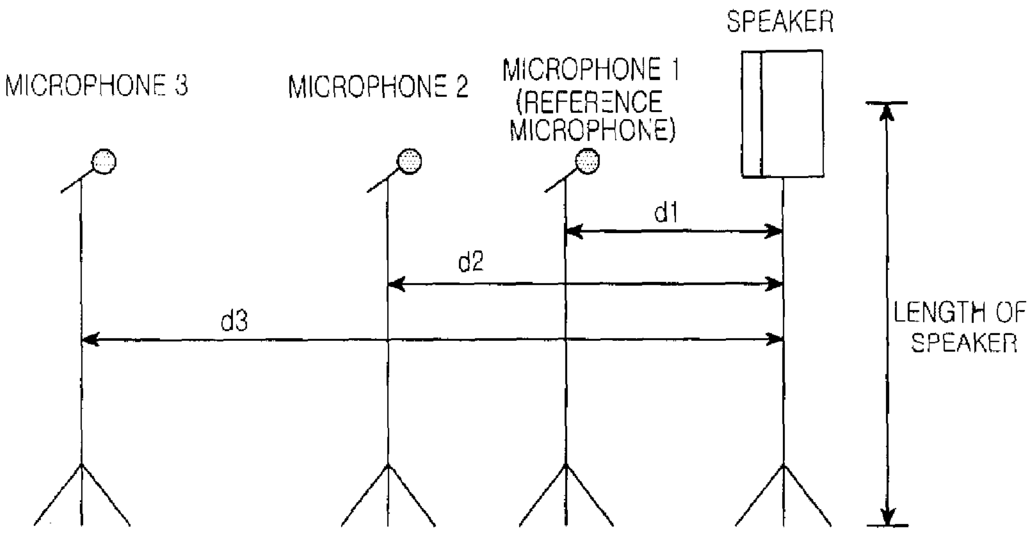
FIG. 1 is a view illustrating a voice collection environment used to evaluate the performance of a microphone according to an exemplary embodiment of the present invention.

Hereinafter, exemplary embodiments of the present invention will be described with reference to the accompanying drawings. It is to be understood that the claimed invention is not limited to the examples shown and described herein. For the purposes of clarity and simplicity, a detailed description of known functions and configurations incorporated herein will be omitted when such inclusion may obscure appreciation of the subject matter of the present invention by a person of ordinary skill in the art.

The present invention implements a function for evaluating the performance of a microphone for speech recognition at a relatively increased distances so that when used with a robot, the robot will be able to recognize speech received via the microphone. Particularly, since a robot, including a network robot, recognizes certain predetermined speech in order to recognize/identify the user and to perceive/keep track of its surroundings, objective evaluation criteria permit for a more effective manner for choosing a microphone to be used in conjunction with a robot. Therefore, the present invention provides methods of measuring a degree of attenuation of the voice, measuring a degree of distortion of the voice, and simultaneously measuring the degree of attenuation of the voice and the degree of distortion of the voice. By establishing a microphone choice standard which can digitize the speech recognition performances of robots, as described above, it becomes possible to choose a microphone which has good sensitivity and can receive a voice without distortion when picking up the voice at a large/increasingly large distances.

Meanwhile, some exemplary methods for evaluating the performance of a microphone according to the present invention are as follows. First, the present invention proposes an exemplary method for measuring a degree of attenuation of a voice, which represents the amount of accuracy of a voice output at a large distance has based on the distance. Second, the present invention proposes a exemplary method for measuring a degree of distortion of a voice, which represents the accuracy of a voice can be without distortion in spite of multiple noise sources. Third, the present invention proposes an exemplary method for simultaneously measuring the degree of attenuation of a voice and the degree of distortion of the voice. When the methods as described above are used, the result of each measurement is expressed as a digitized value, so that it is possible to compare different types of microphones with each other. In addition, such a microphone performance evaluation method may be provided as a guideline to those who provide a speech recognition function for a robot to ensure accuracy of operation.

Here, one example of a robot to which the present invention can be applied includes a network robot. The network robot provides a robot platform with various services through communication with a server by using a network, e.g., a wired network, a wireless network, etc., a wired/wireless interworking protocol, and a network security technology, regardless of time and space. This enables a robot to overcome its own spatial and functional limitations and to provide various services to the user.

It is required that such speech recognition function for a robot is operable at relatively increased distances, for the convenience of the user. In order to achieve speech recognition with a microphone picking up a voice generated from a location far away from a robot, as described above, the performance of the microphone is important above all. That is, if a voice input through a microphone has been distorted, or if the sensitivity for the voice has been dropped, it exerts a great adverse influence upon the quality of the voice and a speech recognition rate.

First, in order to evaluate the performances of microphones, voices input to the microphones are preferably collected in the same environment. Such a voice collection environment may be established, for example, as shown in FIG. 1, wherein various voice collection environments may be established if only a plurality of the same microphones and a noise source are included. Therefore, the voice collection environment is not in any way limited by the construction shown in FIG. 1.

FIG. 1 is a view illustrating a voice collection environment used to evaluate the performance of a microphone according to an exemplary embodiment of the present invention, in which microphones #1, #2, and #3 typically comprise similar types of microphone, and a speaker may act as a noise source. Since a speaker itself has noise, it is recommended that at least a monitor speaker for a studio be used.

In the voice collection environment shown in FIG. 1, microphone #1 represents a reference microphone, wherein it is assumed that microphone #1 picks up a voice at a distance of "d1" from the speaker. Microphones #2 and #3 are located at distances of "d2" and "d3" from the speaker, respectively. D3 is an increased distance away from d1, for example. In such a construction, as voices recorded through microphones #2 and #3 have a characteristic similar to that recorded through microphone #1, microphones #2 and #3 correspond to a microphone having better performance.

In a general voice recording environment, when there are no obstacles, sound is attenuated according to distance from the reference position of a sound source. For example, in the case of a point sound source, whenever the distance from the reference position is doubled, an attenuation of 6.02 dB is caused according to the inverse square law. However, in an indoor environment, reverberation is generated due to surrounding walls or obstacles, so that the attenuation is not generated beyond a certain distance away from the reference position. According to the present invention, voice data to evaluate the performance of a microphone is collected in a non-reverberation environment so that measuring a degree of attenuation can be prevented from being disturbed.

Meanwhile, before a voice signal is reproduced from the speaker, it is necessary to set a gain thereof. Before a voice signal is reproduced, the gain of the speaker is controlled such that when a pure sinusoidal signal with 1 kHz is input to the speaker, a sound of about 80 dB is measured by a sound level meter at a location 1 meter away from the speaker. Approximately 80 dB is equal to the amplitude of a noise caused when a vacuum cleaner is turned on at a distance of 1 m.

In addition, it is preferable to adjust the gains of microphone preamplifiers, in which an evaluation measure according to the present invention is based on values not varying depending on the variance in the gain of a particular microphone preamplifier. Therefore, before voices are collected, it is preferable that the gains of the preamplifiers of the three microphones are set to have the same value. In this case, after the gain of the speaker has been set, a voice signal input through microphone #1, which is the reference microphone, must not be clipped.

When voice data has been collected in the environment as shown in FIG. 1, the voice data is input to microphones in order to evaluate the performances of the microphones, so that it is possible to identify the characteristics of each microphone for speech recognition of an actual robot.

Figure 2:
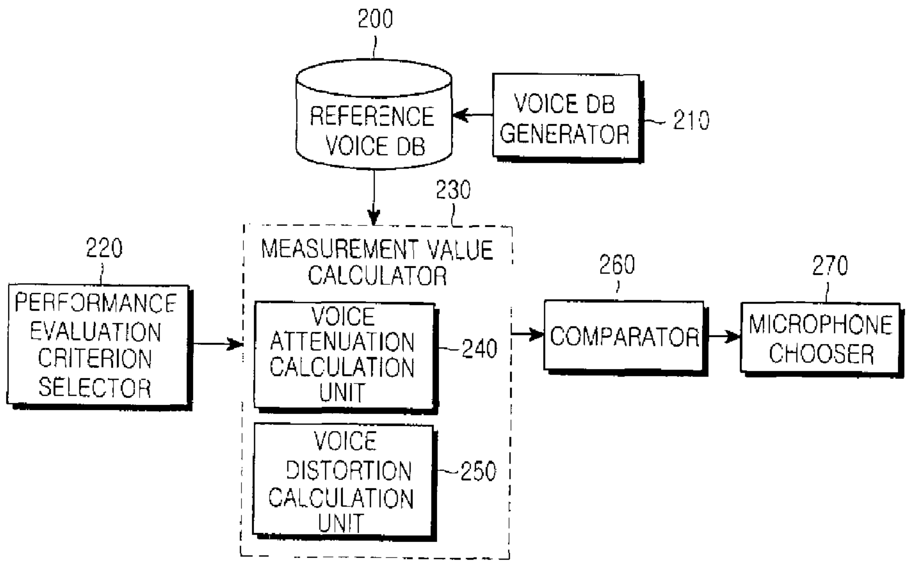
FIG. 2 is a block diagram illustrating the configuration of a microphone evaluation system according to an exemplary embodiment of the present invention.

FIG. 2 shows an exemplary configuration of a microphone evaluation system which performs a measuring operation for evaluating the performance of a microphone. More particularly, FIG. 2 is a block diagram illustrating the configuration of a microphone evaluation system according to an exemplary embodiment of the present invention.

The microphone evaluation system typically includes, for example, a reference voice database (DB) 200, a voice DB generator 210, a performance evaluation criterion selector 220, a measurement value calculator 230, a comparator 260, and a microphone chooser 270.

First, the reference voice DB 200 stores voice data required for performance evaluation of at least two microphones, in which the voice data includes normal voice recorded according to various peoples' speaking voice. The reference voice DB generator 210 makes a database of voice data recorded at the positions of the reference microphone and the comparative microphones at different (varying) distances with respect to a speaker in an exemplary environment as shown in FIG. 1.

Still referring to FIG. 2, in this case, the voice data stored in the reference voice DB 200 corresponds to voice data stored in a non-reverberation environment. When the reference voice DB 200 is used, as described above, it is possible to evaluate different types of microphones objectively. That is, by inputting the same voice to the plurality of microphones, attenuation and distortion according to distance are measured.

The performance evaluation criterion selector 220 determines when any one method is selected from among: a method of measuring a degree of attenuation of a voice, a method of measuring a degree of distortion of a voice, and a method of measuring a degree of attenuation of a voice and a degree of distortion of the voice at the same time.

In addition, when the output properties of microphones of the same type are to be measured at different distances, the performance evaluation criterion selector 220 determines if the microphones have been designated as a reference microphone and/or a target microphone. Such a selection may be performed by the user or a provider who provides a speech recognition function using a robot. For example, in FIG. 1 when microphone 1 is the reference microphone, the target microphone may be either microphone 2 or microphone 3.

Meanwhile, according to a selection result of the performance evaluation criterion selector 220, the measurement value calculator 230 calculates a degree of attenuation of a voice and/or a degree of distortion of the voice. To this end, the measurement value calculator 230 includes a voice attenuation calculation unit 240 and a voice distortion calculation unit 250.

By the measurement value calculator 230, the output property of each microphone is digitized and output, in which the output property of each microphone according to the input of a voice is typically digitized by equations such as those proposed below. A measurement value digitized as described above functions as an objective measure in evaluating the performance of a microphone.

Still referring to FIG. 2, a measurement value output from the measurement value calculator 230 is transferred to the comparator 260. Then, the comparator 260 outputs a result of the comparison between a reference value and the measurement value of the microphone to the microphone chooser 270. In this case, the reference value corresponds to a threshold value distinguishing a range where sensitivity is high, even at a large distance, in the case of measuring attenuation of a voice, and the reference value corresponds to a threshold value distinguishing a range where there is no distortion of a voice in the case of measuring distortion of a voice. Meanwhile, in the case where a robot is to provide a high-performance speech recognition function, the reference value becomes higher because a high-performance microphone is required. As described above, the reference value may be determined differently according to those who provide a speech recognition function using a robot.

Accordingly, the microphone chooser 270 can determine whether to choose the target microphone for which measurements have been performed, based on a comparison result by the comparator 260. That is, the microphone chooser 270 may either choose or disqualify the measured target microphone based on comparison results made by the comparator 260.

Figure 3:
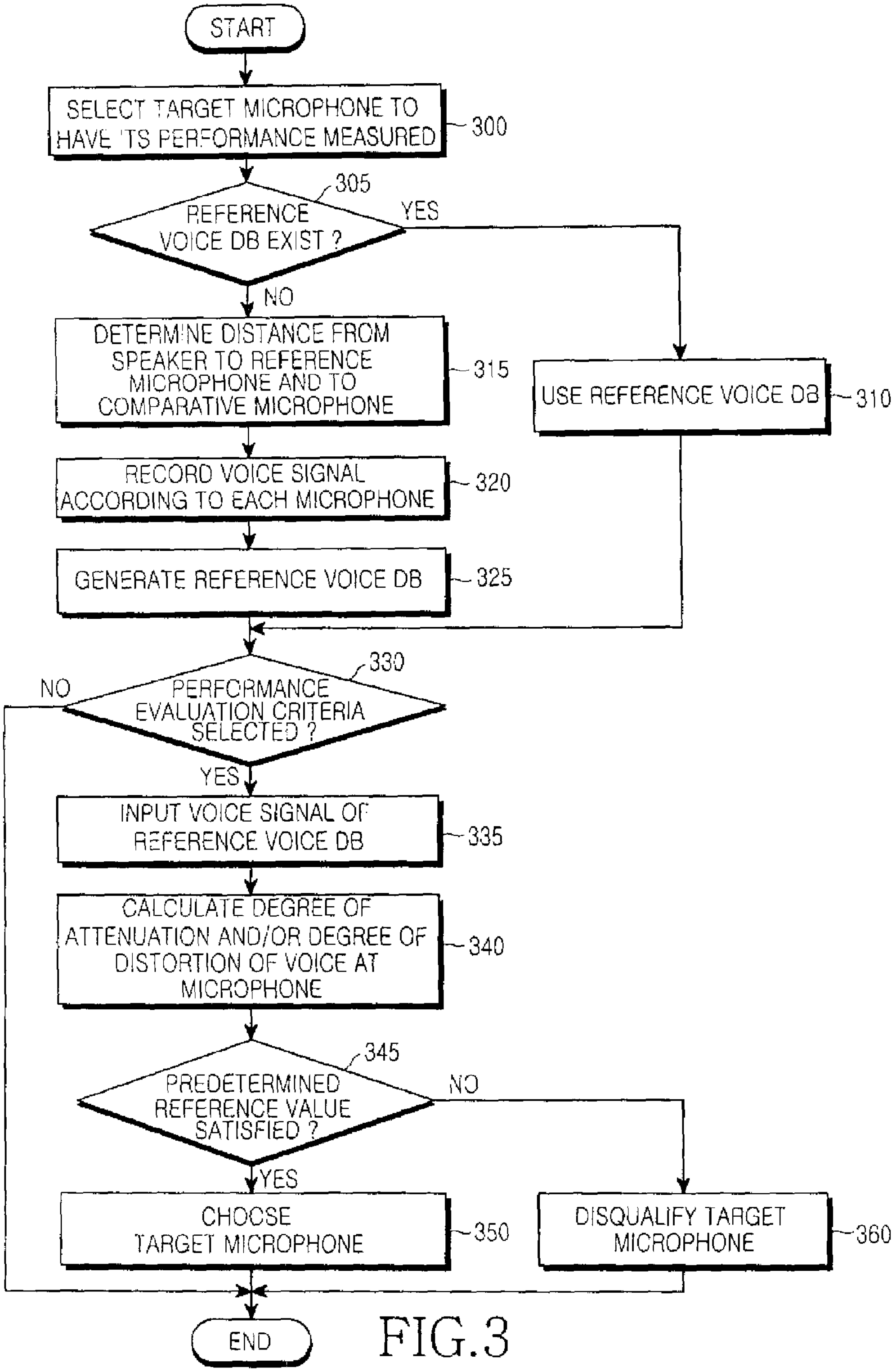
FIG. 3 is a flowchart illustrating a procedure for evaluating the performance of a microphone according to an exemplary embodiment of the present invention.

Hereinafter, an exemplary operation of the components in the microphone evaluation system described above will be described with reference to FIG. 3. FIG. 3 is a flowchart illustrating an example of a procedure for evaluating the performance of a microphone according to an exemplary embodiment of the present invention.

According to FIG. 3, in an exemplary embodiment of the present invention, in step 300 when a target microphone having a performance of which to be measured, has been designated in order to apply a microphone performance evaluation mode, the microphone evaluation system proceeds to step 305 in which the microphone evaluation system determines if there is a reference voice DB exists (or alternatively, is not accessible). Such a reference voice DB stores voices to be input to the target microphone in order to measure the objective performance of the microphone. When there is no reference voice DB at step 305, the microphone evaluation system determines the respective distances from a speaker to a reference microphone and a comparative microphone in step 315, and records a voice signal according to each microphone in step 320. Through steps 315 and 320, a reference voice DB is generated in step 325. With regard to the term comparative microphone, for example, in case where there is no reference voice DB, if a reference microphone (for example, microphone 1 in FIG. 1) is used to record a voice signal, and the comparative microphone would be either microphone 2 or microphone 3.

In contrast, when it is determined in step 305 that there is a reference voice DB, the reference voice DB is designed for use in step 310.

Thereafter, still referring to FIG. 3, when a reference voice DB including a voice signal to be inputted to the target microphone is ready, the microphone evaluation system determines if a performance evaluation criterion has been selected in step 330. In this case, according to an exemplary embodiment of the present invention, the microphone evaluation system determines if any one evaluation criterion has been selected from among a degree of attenuation of a voice, a degree of distortion of the voice, and/or both a degree of attenuation and a degree of distortion. When it is determined that any one evaluation criterion has been selected, the microphone evaluation system proceeds to step 335 in which the microphone evaluation system inputs a voice signal in the reference voice DB to the target microphone.

At step 340, the microphone evaluation system calculates a measurement value, that is, a degree of attenuation of the voice and/or a degree of distortion of the voice, which is obtained through the target microphone according to the input of the voice signal. That is, the microphone evaluation system digitalizes and outputs the output property of the target microphone.

Next, in step 345, the microphone evaluation system determines if the calculated measurement value satisfies a predetermined reference value. When it is determined that the calculated measurement value satisfies a predetermined reference value, the microphone evaluation system proceeds to step 350 in which the microphone evaluation system finally determines a choice of the target microphone. That is, when the calculated measurement value satisfies the predetermined reference value, the microphone evaluation system decides that the target microphone is suitable for long-distance speech recognition.

In contrast to step 350, when it is determined at step 345 that the calculated measurement value does not satisfy the predetermined reference value, the microphone evaluation system proceeds to step 360 in which the microphone evaluation system disqualifies the target microphone.

Meanwhile, a method of digitalizing the output property of a microphone in the measurement value calculator 230 according to an exemplary embodiment of the present invention is as follows. That is, the output property of a microphone according to an input of a voice is digitalized by equations such as those proposed below.

First, equations 1a and 1b are proposed as criteria for measurement of a degree of attenuation of a voice.

$$SNR_{avg} \equiv 10\log_{10}\left(\frac{\sum_{t\in T_s} s^2(t) - \sum_{t\in T_n} s^2(t)}{\sum_{t\in T_n} s^2(t)}\right) \tag{1a}$$

Equation 1a is an exemplary equation for obtaining an averaged signal-to-noise ratio (SNR) of an entire voice signal.

In equation 1a, $T_s$ represents a voice section, $T_n$ represents a noise section, and s(t) represents a voice signal at a target microphone.

The averaged SNR as shown in equation 1a represents a ratio of voice energy to noise energy, in which a higher averaged SNR means that the corresponding microphone has better performance. Such an averaged SNR is used for comparison between microphones under the same condition, including the same preamplifier gain, the same speaker gain, and an equal distance to each microphone, etc. In order to calculate the averaged SNR, it is necessary to identify a voice section and a non-voice section.

$$SNR_{seg} \equiv \frac{10}{M}\sum_{m=0}^{M-1}\log_{10}\left(\frac{\sum_{t=Nm}^{Nm+N-1}[s_{mic1}(t)]^2}{\sum_{t=Nm}^{Nm+N-1}[s_{mic1}(t)-s_{mic2}(t)]^2}\right) \tag{1b}$$

Equation 1b is an exemplary equation for obtaining an SNR according to each segment of a voice signal.

In equation 1b, M represents the number of frames, N represents the number samples included in one frame, m represents a frame index, $s_{mic1}(t)$ represents a signal at a reference microphone, e.g., microphone #1, and $s_{mic2}(t)$ represents a signal at a comparative microphone, e.g., microphone #2 or #3.

When the SNR of a voice signal is calculated, the voice signal is a non-stationary signal, in which a high-energy part and a low-energy part are repeated. Therefore, when an SNR is calculated over the entire voice signal, as shown in equation 1a, the SNR may be greatly influenced by the high-energy parts of the voice signal. In consideration of such an influence, equation 1b may be used in such a manner so as to calculate SNRs according to voice sections of a predetermined size and then to calculate obtain an average of the SNRs in order to compare the output properties of microphones.

$$MMR \equiv 10\log_{10}\left(\frac{\sum_{t\in T_s} s^2_{mic1}(t) - \sum_{t\in T_n} s^2_{mic1}(t)}{\sum_{t\in T_s} s^2_{mic2}(t) - \sum_{t\in T_n} s^2_{mic2}(t)} \times \frac{\sum_{t\in T_n} s^2_{mic2}(t)}{\sum_{t\in T_n} s^2_{mic1}(t)}\right) \quad (1c)$$

Equation 1c is an exemplary equation for obtaining a microphone-to-microphone ratio (MMR) in terms of voice attenuation.

In equation 1c, $T_s$ represents a voice section, $T_n$ represents a noise section, $S_{mic1}(t)$ represents a voice signal at a reference microphone, e.g., microphone #1, and $S_{mic2}(t)$ represents a voice signal at a comparative microphone, e.g., microphone #2 or #3. In this case, a voice signal input to each microphone is provided from the reference voice DB 200. When the MMR in terms of voice attenuation calculated by equation 1c is less, it means that the corresponding microphone has better performance.

Figure 4:
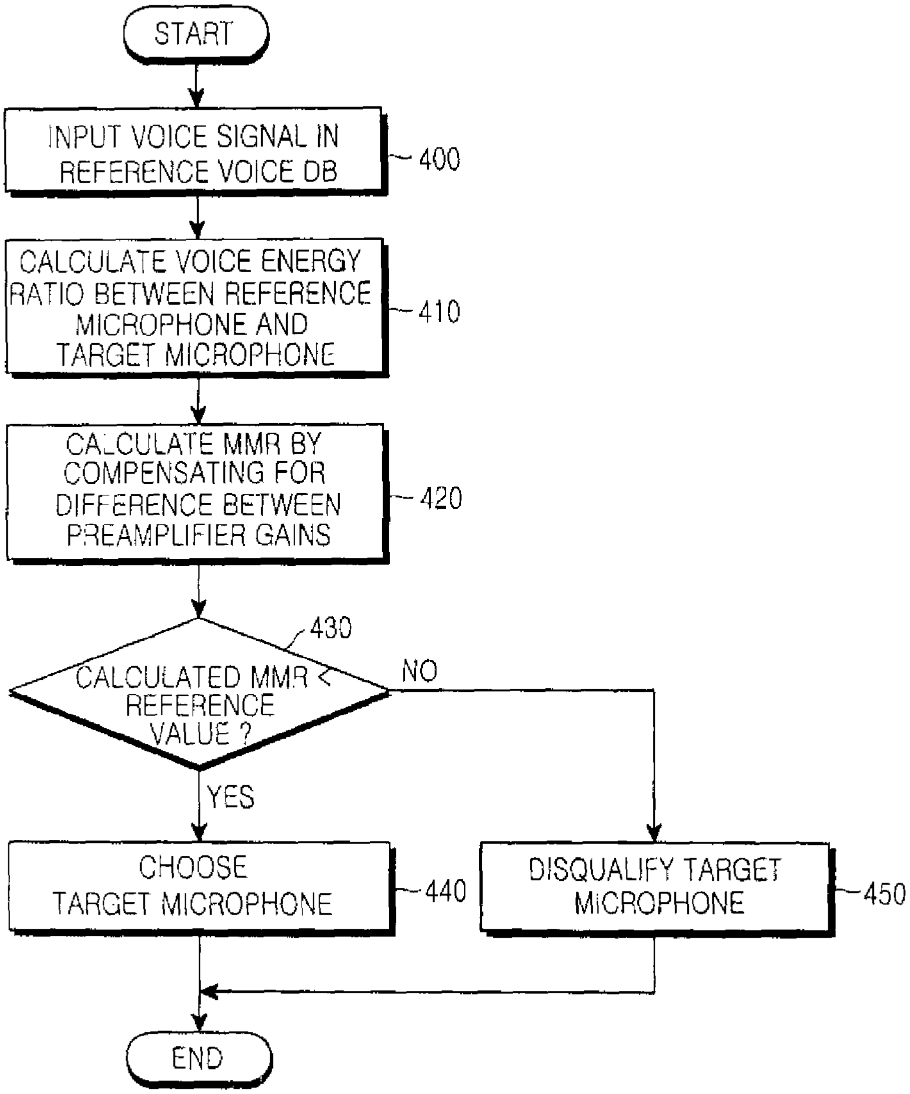
FIG. 4 is a flowchart illustrating a procedure of evaluating the performance of a microphone by using a microphone-to-microphone ratio (MMR) according to an exemplary embodiment of the present invention.

A procedure of evaluating the performance of a microphone based on equation 1c will now be described with reference to FIG. 4. FIG. 4 is a flowchart illustrating a procedure of evaluating the performance of a microphone by using the MMR according to an exemplary embodiment of the present invention.

Now referring to FIG. 4, in order to apply the microphone performance evaluation mode, the microphone evaluation system inputs a voice signal in the reference voice DB to a target microphone to be evaluated (step 400). According to the input of the voice signal, the microphone evaluation system calculates a voice energy ratio between a reference microphone and the target microphone in step 410.

Referring to equation 1c, first, the energy of a voice section and the energy of a noise section are calculated with respect to each of the reference and target microphones. In equation 1c, $$\sum_{t\in T_s} s^2_{mic1}(t)$$

is a value obtained by adding up the square of the value of the voice signal at the reference microphone a number of times corresponding to the length of the voice section and represents the energy of the voice section, and $$\sum_{t\in T_n} s^2_{mic1}(t)$$

represents the energy of the noise section of the reference microphone. In equation 1c, $$\frac{\sum_{t\in T_s} s^2_{mic1}(t) - \sum_{t\in T_n} s^2_{mic1}(t)}{\sum_{t\in T_s} s^2_{mic2}(t) - \sum_{t\in T_n} s^2_{mic2}(t)},$$

a difference between the voice-section energy and the noise-section energy at the reference microphone divided by a difference between voice-section energy and noise-section energy at a comparative microphone, represents a voice energy ratio.

Still referring to FIG. 4, when the voice energy ratio has been calculated, as described above, the microphone evaluation system proceeds to step 420 in which the microphone evaluation system calculates an MMR representing a degree of attenuation of the voice by compensating for a difference between the gains of preamplifiers. In equation 1c, $$\frac{\sum_{t\in T_n} s^2_{mic2}(t)}{\sum_{t\in T_n} s^2_{mic1}(t)},$$

the energy of the noise section at the comparative microphone divided by the energy of the noise section at the reference microphone, is a term for compensating for a difference between the gains of preamplifiers if the difference exists. The voice energy ratio is multiplied by the term for compensation for the gain difference, before the logarithm of the voice energy ratio is taken in order to obtain the MMR.

When the MMR has been calculated by taking the logarithm of the value obtained as above, the microphone evaluation system proceeds to step 430 in which the microphone evaluation system determines if the calculated MMR is less than a reference value. When it is determined that the calculated MMR is less than the reference value, the microphone evaluation system proceeds to step 440 in which the microphone evaluation system determines choice of the target microphone. In contrast, when it is determined that the calculated MMR is greater than the reference value, the microphone evaluation system proceeds to step 450 in which the microphone evaluation system disqualifies the target microphone. As described above, the MMR has an advantage of enabling different types of microphones to be compared with each other.

Equations 1a to 1c, which are evaluation criteria for measurement of a degree of attenuation of a voice, as described above, are used to digitalize the output property of a microphone, in which a measured value is used to determine a degree of attenuation of a voice at a microphone according to distance.

Meanwhile, equations 2a to 2c are proposed as criteria for measurement of a degree of distortion of a voice. The measurement of a degree of distortion of a voice is achieved through measurement of only a pure voice section, differently from the aforementioned attenuation measurement method, by means of a Linear Prediction Coefficient (LPC), which is a vocal tract model, and a Mel-frequency cepstral coefficient based on the sense of hearing.

$$LAR \equiv \frac{1}{M}\sum_{m=0}^{M-1}\left[\left[\frac{1}{P}\sum_{p=0}^{P-1}\left[\frac{\log_{10}\frac{1+r_{m,mic1}(p)}{1-r_{m,mic1}(p)} -}{\log\frac{1+r_{m,mic2}(p)}{1-r_{m,mic2}(p)}}\right]^2\right]^{\frac{1}{2}}\right] \quad (2a)$$

Equation 2a is an equation for obtaining a log area ratio.

In equation 2a, M represents the number of frames, m represents a frame index, $r_{m,mic1}(t)$ represents an LP reflection coefficient of an $m^{th}$ frame obtained through a reference microphone, for example, microphone #1, $r_{m,mic2}(t)$ represents an LP reflection coefficient of an $m^{th}$ frame at a comparative microphone, for example, microphone #2 or #3, and P represents an order of an LP refraction coefficient.

A log area ratio as described above represents a difference in shapes of LPC spectrums based on a vocal tract model, in which a smaller log area ratio means that the corresponding microphone has better performance. Such a log area ratio can be obtained with respect to only a voice section, and represents only a degree of distortion of a voice, regardless of a degree of attenuation according to distance.

Obtaining the log area ratio means extracting features (i.e., cepstral coefficient) of a voice signal at a microphone and comparing variations in the features.

$$LLR \equiv \frac{1}{M}\sum_{m=0}^{M-1}\left[\log\left(\frac{\overline{a}_{m,mic1}R_{m,mic1}\overline{a}_{m,mic2}^{T}}{\overline{a}_{m,mic2}R_{m,mic1}\overline{a}_{m,mic1}^{T}}\right)\right] \tag{2b}$$

Equation 2b is an equation for obtaining a log-likelihood ratio.

In equation 2b, M represents the number of frames, m represents a frame index, $\overline{a}_{m,mic1}$ represents an LPC vector of an $m^{th}$ frame obtained through the reference microphone, $\overline{a}_{m,mic2}$ represents an LPC vector of an $m^{th}$ frame obtained through the comparative microphone, and $R_{m,mic1}$ represents a Toeplitz autocorrelation matrix of an $m^{th}$ frame obtained through the reference microphone.

The log-likelihood ratio is used to measure a degree of distortion of an LPC spectrum, in which a smaller log-likelihood ratio means that the corresponding microphone has better performance.

$$C_{dist} \equiv \frac{1}{M}\sum_{m=0}^{M-1}\left[\left\|\frac{1}{P}\sum_{p=0}^{P-1}\left[c_{m,mic1}(p)-c_{m,mic2}(p)\right]\right\|^{2}\right] \tag{2c}$$

Equation 2c is an equation for obtaining a cepstral distance.

In equation 2c, M represents the number of frames, m represents a frame index, $c_{m,mic1}(p)$ represents a cepstral coefficient of an $m^{th}$ frame obtained through the reference microphone, for example, microphone #1, $c_{m,mic2}(p)$ represents a cepstral coefficient of an $m^{th}$ frame obtained through the comparative microphone, for example, microphone #2 or #3, and P represents an order of a cepstral coefficient.

Such a cepstral distance represents a distance measure between cepstral vectors "c1" and "c2." In addition, a difference also between cepstral coefficients of a Mel-spectrum based on a hearing model represents only a degree of distortion of a voice, regardless of a degree of attenuation. When a cepstral distance has a smaller value, it means that the corresponding microphone has better performance.

Meanwhile, equations 3a to 3b are proposed as criteria for measuring a degree of attenuation of a voice and a degree of distortion of the voice at the same time.

$$IS \equiv \frac{1}{M}\sum_{m=0}^{M-1}\left[\frac{\sigma_{m,mic1}^{2}}{\sigma_{m,mic2}^{2}}\cdot\frac{\overline{a}_{m,mic1}R_{m,mic1}\overline{a}_{m,mic1}^{T}}{\overline{a}_{m,mic2}R_{m,mic1}\overline{a}_{m,mic2}^{T}}+\log\left(\frac{\sigma_{m,mic2}^{2}}{\sigma_{m,mic1}^{2}}\right)-1\right] \tag{3a}$$

Equation 3a is an equation for obtaining an Itakura-Saito distortion measure. In equation 3a, M represents the number of frames, m represents a frame index, $\overline{a}_{m,mic1}$ represents an LPC vector of an $m^{th}$ frame obtained through a reference microphone, $\overline{a}_{m,mic2}$ represents an LPC vector of an $m^{th}$ frame obtained through a comparative microphone, $R_{m,mic1}$ represents a Toeplitz autocorrelation matrix of an $m^{th}$ frame obtained through the reference microphone, ${\sigma_{m,mic1}}^2$ represents an all-pole gain of the reference microphone, ${\sigma_{m,mic2}}^2$ represents an all-pole gain of the comparative microphone, and $R_{m,mic1}$ represents a Toeplitz autocorrelation matrix of an $m^{th}$ frame obtained through the reference microphone.

The Itakura-Saito distortion measure represents a degree of similarity between LPC spectrums of a signal input through microphones according to distance, and is measured in a voice section. A smaller value of the Itakura-Saito distortion measure means that the corresponding microphone has better performance.

$$WSS \equiv \frac{1}{M}\sum_{m=0}^{M-1}\left[u_E(E_{m,mic1}-E_{m,mic2})+\sum_{p=1}^{P}u(p)(\Delta S_{m,mic1}(p)-\Delta S_{m,mic2}(p))^{2}\right] \tag{3b}$$

Equation 3b is an equation for obtaining a weighted spectral slope measure.

In equation 3b, M represents the number of frames, m represents a frame index, P represents the number of critical band filter banks, p represents an index of critical band filter banks, $E_{m,mic1}$ represents energy of an $m^{th}$ frame obtained through a reference microphone, $E_{m,mic2}$ represents energy of an $m^{th}$ frame obtained through a comparative microphone, $U_E$ represents a weighting constant, $\Delta S_{m,mic1}(p)$ represents a slope of a $p^{th}$ critical band spectrum of an $m^{th}$ frame obtained through the reference microphone, $\Delta S_{m,mic2}(p)$ represents a slope of a $p^{th}$ critical band spectrum of an $m^{th}$ frame obtained through the comparative microphone, and u(p) represents a weighting coefficient.

The weighted spectral slope measure is used to calculate a degree of distortion of a voice by obtaining smoothed voice spectrums by means of critical band filter banks and measuring a degree of similarity between slopes, instead of values of spectrums, in each band. When the value calculated as above is relatively smaller, this smaller value means that the corresponding microphone has better performance.

In addition to equations 3a and 3b, Perceptual Evaluation of Speech Quality (PESQ) may be used as a method for measuring a degree of attenuation of a voice and a degree of distortion of the voice at the same time. The PESQ is a measure representing how much a voice signal obtained through a comparative microphone, e.g. microphone #2 or #3, is similar to a voice signal obtained through a reference microphone, e.g. microphone #1, in terms of articulation, by comparing the two voice signals. The value of the PESQ is a numerical value representing a degree of objective sound-quality enhancement, which is matched to a similar value in a subjective communication quality (i.e. mean option score (MOS)) used at the time of evaluating the quality of a voice. The value of the PESQ is in a range of −0.5 to 4.5, in which, for example, as a voice is less distorted from a reference voice, the PESQ has a value closer to 4.5. That is, when the value of the PESQ is closer to 4.5, it means that the corresponding microphone has better performance.

As described above, the present invention proposes a standard in connection with a choice of a microphone for enabling a robot to recognize voices at a relatively large distance, and the standard can be presented as a guideline to those who provide a speech recognition function in a robot. Accordingly, since those who enter a robot field may employ the same standard, the uncertainty of robot performance and a manufacturing cost are reduced, duplicate investment is prevented, and a period of time for development is shortened, thereby lowering entry barriers into the robot field. A resulting benefit of the present invention is that it is expected that the time when users are to be provided with low-priced robots providing a high-performance speech recognition function will be advanced. In addition, the microphone evaluation methods according to the present invention can be utilized for input of a voice at the time of manufacturing products, such as actual robots, thereby increasing the productivity.

While the present invention has been shown and described with reference to certain exemplary embodiments thereof, it will be understood by those skilled in the art that various changes in form and details may be made therein without departing from the spirit and scope of the invention as defined by the appended claims. The invention is not limited to the examples that were provided herein for illustrative purposes. Accordingly, the scope of the invention is not to be limited by the above exemplary embodiments but by the claims.

What is claimed is:

1. A system for evaluating performance of a microphone for long-distance speech recognition in a robot, the system comprising:

a reference voice database for storing a voice signal required for performance evaluation of at least two microphones;

a measurement value calculator for calculating both attenuation and distortion of the input voice signal at the same time, when the voice signal from the reference voice database is input to a reference microphone and a target microphone from among the at least two microphones;

a comparator for comparing a value calculated by the measurement value calculator with a reference value; and a microphone chooser for determining whether to choose the target microphone according to a result of the comparison;

wherein a respective preamplifier for each of the microphones is adjusted to have a same value of gain so that an evaluation measure of performance of all the microphones does not depend on a variance in gain of a particular preamplifier, and wherein the microphones are arranged at different distances from the reference microphone; and a reference voice DB generator for generating the reference voice database by determining a distance from a speaker to a reference microphone and the target microphone, and for recording a voice signal according to each microphone.

2. The system as claimed in claim 1, wherein the measurement value calculator calculates attenuation of the voice signal by means of any one of an averaged signal-to-noise ratio (SNR) of an entire voice signal input to the microphone and a segmental SNR of the voice signal.

3. The system as claimed in claim 1, wherein the measurement value calculator calculates attenuation of the voice signal by means of a voice attenuation ratio between the reference microphone and the target microphone.

4. A system for evaluating performance of a microphone for long-distance speech recognition in a robot, the system comprising:

a reference voice database for storing a voice signal required for performance evaluation of at least two microphones;

a measurement value calculator for measuring and digitalizing at least one of attenuation and distortion of the input voice signal according to a selected performance evaluation criterion, when the voice signal from the reference voice database is input to a reference microphone and a target microphone from among the at least two microphones;

a comparator for comparing a measurement result digitalized by the measurement value calculator with a reference value; and a microphone chooser for determining whether to choose the target microphone according to a result of the comparison;

wherein the measurement value calculator measures and digitalizes attenuation of the voice signal by means of a voice attenuation ratio between the reference microphone and the target microphone, and wherein the voice attenuation ratio comprises a Microphone-to-Microphone Ratio (MMR) calculated by:

$$MMR \equiv 10\log_{10}\left(\frac{\sum_{t\in T_s} s_{mic1}^2(t) - \sum_{t\in T_n} s_{mic1}^2(t)}{\sum_{t\in T_s} s_{mic2}^2(t) - \sum_{t\in T_n} s_{mic2}^2(t)} \times \frac{\sum_{t\in T_n} s_{mic2}^2(t)}{\sum_{t\in T_n} s_{mic1}^2(t)}\right),$$

wherein $T_s$ represents a voice section, $T_n$ represents a noise section, $s_{mic1}(t)$ represents a voice signal at the reference microphone, and $s_{mic2}(t)$ represents a voice signal at a comparative microphone.

5. The system as claimed in claim 1, wherein the measurement value calculator calculates distortion of the voice signal by means of any one of a log area ratio, a log-likelihood ratio measure, and a cepstral distance.

6. The system as claimed in claim 1, wherein the measurement value calculator calculates distortion of the voice signal by means of any one among an Itakura-Saito distortion measure, a weighted spectral slope measure, and a Perceptual Evaluation of Speech Quality.

7. A system for evaluating performance of a microphone for long-distance speech recognition in a robot, the system comprising:

a reference voice database for storing a voice signal required for performance evaluation of at least two microphones;

a measurement value calculator for calculating a voice attenuation ratio between the microphones in order to measure attenuation of the input voice signal, when the voice signal from the reference voice database is input to a reference microphone and a target microphone from among the at least two microphones; and a microphone chooser for determining whether to choose the target microphone, according to a result of comparison between a result calculated by the measurement value calculator and a reference value;

wherein the measurement value calculator calculates energy of a voice section and energy of a noise section for each of the reference and target microphones, divides a difference between the voice-section energy and noise-section energy of the reference microphone by a difference between the voice-section energy and noise-section energy of the target microphone, multiplies a result value of the division by a value which has been obtained by dividing the noise-section energy of the target microphone by the noise-section energy of the reference microphone in order to compensate for a difference between preamplifier gains, and takes a logarithm of a result value of the multiplication, thereby obtaining the voice attenuation ratio between.

8. The system as claimed in claim 7, wherein the microphone chooser determines choosing the target microphone when the result calculated by the measurement value calculator is less than the reference value.

9. A method for evaluating performance of a microphone for long-distance speech recognition in a robot, the method comprising the steps of:

inputting a voice signal required for performance evaluation to a reference microphone and a target microphone from among at least two microphones;

calculating a voice attenuation ratio between the microphones in order to measure attenuation of the input voice signal when the voice signal is input;

comparing the calculated voice attenuation ratio between the reference microphone and target microphone with a reference value; and determining whether to choose the target microphone according to a result of the comparison;

wherein the voice attenuation ratio comprises a Microphone-to-Microphone Ratio (MMR) between the microphones which is calculated by:

$$MMR \equiv 10\log_{10}\left(\frac{\sum_{t\in T_s} s_{mic1}^2(t) - \sum_{t\in T_n} s_{mic1}^2(t)}{\sum_{t\in T_s} s_{mic2}^2(t) - \sum_{t\in T_n} s_{mic2}^2(t)} \times \frac{\sum_{t\in T_n} s_{mic2}^2(t)}{\sum_{t\in T_n} s_{mic1}^2(t)}\right),$$

wherein $T_s$ represents a voice section, $T_n$ represents a noise section, $s_{mic1}(t)$ represents a voice signal at the reference microphone, and $s_{mic2}(t)$ represents a voice signal at a comparative microphone.

10. The method as claimed in claim 9, wherein, in the step of determining whether to choose the target microphone, the target microphone is finally determined to be chosen when the calculated voice attenuation ratio between the microphones is less than the reference value.

11. The method according to claim 9, wherein the reference value is retrieved from a reference voice database (DB).

12. The method according to claim 9, wherein the reference value is determined by generating a reference voice database by determining a distance from a speaker to a reference microphone and the target microphone, and for recording a voice signal according to each microphone.

13. A method for evaluating performance of a microphone for long-distance speech recognition in a robot, the method comprising the steps of:

storing a voice signal required for performance evaluation of at least two microphones;

inputting the voice signal to a reference microphone and a target microphone among the at least two microphones;

calculating both attenuation and distortion of the voice signal at the same time when the voice signal is input;

comparing the calculated result with a reference value; and determining whether to choose the target microphone according to a result of the comparison; and wherein attenuation of the voice signal is calculated by using a voice attenuation ratio between the reference microphone and the target microphone;

wherein a respective preamplifier for each of the microphones is adjusted to have a same value of gain so that an evaluation measure of performance of all the microphones does not depend on a variance in gain of a particular preamplifier and wherein the microphones are arranged at different distances from the reference microphone; and wherein the reference value is determined by generating a reference voice database by determining a distance from a speaker to the reference microphone and the target microphone, and for recording a voice signal according to each microphone.

14. The method as claimed in claim 13, wherein the voice attenuation ratio comprises a Microphone-to-Microphone Ratio (MMR) which is calculated by:

$$MMR \equiv 10\log_{10}\left(\frac{\sum_{t\in T_s} s_{mic1}^2(t) - \sum_{t\in T_n} s_{mic1}^2(t)}{\sum_{t\in T_s} s_{mic2}^2(t) - \sum_{t\in T_n} s_{mic2}^2(t)} \times \frac{\sum_{t\in T_n} s_{mic2}^2(t)}{\sum_{t\in T_n} s_{mic1}^2(t)}\right),$$

wherein $T_s$ represents a voice section, $T_n$ represents a noise section, $s_{mic1}(t)$ represents a voice signal at the reference microphone, and $s_{mic2}(t)$ represents a voice signal at a comparative microphone.

15. The method according to claim 13, wherein the reference value is retrieved from a reference voice database (DB).

* * * * *